United States Patent [19]

Weiss et al.

[11] Patent Number: 4,912,664

[45] Date of Patent: Mar. 27, 1990

[54] METHOD AND APPARATUS FOR GENERATING A MESH FOR FINITE ELEMENT ANALYSIS

[75] Inventors: Jonathan Weiss, Lake Oswego; Patrick D. Fortner, Beaverton, both of Oreg.

[73] Assignee: Mentor Graphics Corporation, Beaverton, Oreg.

[21] Appl. No.: 151,105

[22] Filed: Feb. 1, 1988

[51] Int. Cl.[4] .......................... G06G 7/30; G06F 3/37
[52] U.S. Cl. ................................... 364/577; 364/518; 364/522; 382/22
[58] Field of Search ............... 364/577, 578, 754, 518, 364/521, 522, 746.1; 382/21, 22; 340/729, 747

[56] References Cited

U.S. PATENT DOCUMENTS

| | | | |
|---|---|---|---|
| 4,628,532 | 12/1986 | Stone et al. | 382/21 |
| 4,646,251 | 2/1987 | Hayes et al. | 364/518 |
| 4,649,498 | 3/1987 | Kedem et al. | 364/518 |
| 4,700,402 | 10/1987 | Okai et al. | 382/21 X |
| 4,736,306 | 4/1988 | Christensen et al. | 364/522 X |
| 4,742,473 | 5/1988 | Shugar et al. | 364/521 X |
| 4,748,675 | 5/1988 | Suzuki et al. | 382/21 |
| 4,766,556 | 8/1988 | Arakawa | 340/729 X |
| 4,771,474 | 9/1988 | Takashima et al. | 382/22 X |
| 4,775,946 | 10/1988 | Anjyo | 364/521 X |
| 4,791,583 | 12/1988 | Colburn | 364/522 |
| 4,797,842 | 1/1989 | Nackman | 364/578 |

OTHER PUBLICATIONS

Klein, "How to Design with Finite-Element Analysis," *Plastics Design Forum* (Sep. Oct. 1987).
Rouse, "Fighting it Out in Finite Elements," *Machine Design* (Apr. 9, 1987).
"Lou Crain: The Man Behind Patran," *CAE* (Jul. 1987).
"PCs Ease the Use of FEA," *CAE* (Jul. 1987).
LaBonte et al., "Keep pc boards reliable with thermal-analysis tools", *Electronic Design* (Apr. 28, 1988).
Schiermeier et al., "An Alternate Algorithm for FEA," *Computers in Mechanical Engineering* (Jan. 1987).

Primary Examiner—Parshotam S. Lall
Assistant Examiner—Joseph L. Dixon
Attorney, Agent, or Firm—Klarquist, Sparkman, Campbell, Leigh & Whinston

[57] ABSTRACT

The method of mesh generation comprises a two-step automatic process that requires no user input once a geometric representation of the object has been provided to the apparatus. In the method, the object geometry is first defined in terms of object (subdomain) points, wherein each subdomain is a separate geometric region of the object such as a printed circuit board, a hole in the board, and a component mounted on the board. Bounding points defining a frame around the object geometry are then generated for producing a mesh consisting of at least one element. From the object points and the bounding points an initial mesh of elements is automatically generated according to a unique algorithm. In the second step of the process, each element in this mesh is then individually examined to determine if it meets a predetermined standard of acceptability and, if not, is refined. This process step employs a rule-based expert system to add additional points to the mesh at automatically determined locations for further mesh generation according to the unique algorithm employed. The steps of refinement repeat until each element in the mesh meets the acceptability standard or is considered no longer refinable.

20 Claims, 22 Drawing Sheets

ELEMENT DOES NOT PASS "GOODNESS" CRITERIA

NEW POINT ADDED BY RULE 6

METHOD AND APPARATUS FOR GENERATING A MESH FOR FINITE ELEMENT ANALYSIS

BACKGROUND OF THE INVENTION

This invention relates generally to method and apparatus for finite element analysis and, more particularly, to a method and apparatus for generating a mesh of elements required for the analysis.

Finite element analysis (FEA) is a powerful numerical method for solving mathematical problems in engineering and physics. Finite element analysis is particularly relevant for determining the physical characteristics of an object such as a machine part, a hydraulic system, or printed circuit board. The fundamental concept of the finite element method is that any continuous physical characteristic, such as temperature, pressure, heat, or electric field, can be approximated by a discrete model composed of a set of piecewise continuous functions. These functions are defined over a finite number of subdomains of the object.

Finite element analysis today is typically carried out on a computer and consists of a three-step procedure: preprocessing, processing, and postprocessing. Preprocessing consists of taking data representing the object and generating therefrom a mesh of geometrical elements that cover the domain of the object. Processing is the analysis step, taking the element data and applying mathematical equations employed in the finite element method to solve for a matrix equation of the characteristic across the domain. Postprocessing provides results of the analysis to the user in a form that can be understood, such as a graphical representation of the characteristic by different colors that indicate the characteristic value across the domain.

The preprocessing step of generating an acceptable mesh for analysis is the primary bottleneck in employing finite element analysis. Present mesh generation methods can take from hours to days, depending upon the method employed. Typically, they require the user to pick nodes or vertices of the object in order to form regions in which elements will be generated. For example, the user manually divides the object into quadrilaterals on the computer screen to facilitate mesh generation. The choice of quadrilateral size and shape for optimum mesh generation, however, is not intuitive. The practicing engineer who is not an expert in finite element analysis is thus not likely to make the best choice. Moreover, once the regions are defined, the user must then specify a number of arbitrary vertical and horizontal connection points on the border of the region which are connected to generate a mesh within each region. The mesh that results may contain a number of elements that have poor aspect ratios, e.g., the ratio of the longest side of an element to its shortest side, that could skew the analysis. Only the expertise of the user can prevent this. For this reason, many companies employ expensive specialists to perform finite element analysis on their products. Examples of prior FEA methods that incorporate this type of preprocessing are the ANSYS FEA program from Swanson Analysis Systems, Inc., of Houston, PA; the NASTRAN FEA program from the MacNeal-Schwendler Corp. of Los Angeles, CA; the Patran FEA Program from PDA Engineering of Los Angeles, CA; and the Engineering Library For Modeling (ELM) from Fujitsu of America.

These and other prior FEA methods require continued user input in generating the mesh of elements.

The prior method and similar computer-based FEA methods are certainly an improvement over previous manual methods. But these methods still require considerable time and expertise on the part of the user to generate a mesh. In the process of generating a mesh, the user is forced to concern himself with how to represent a given object domain by a collection of simple geometric subdomains suitable for analysis. This is a difficult and tedious manual task even for the expert.

SUMMARY OF THE INVENTION

Therefore, an object of this invention is to provide an improved method and apparatus for generating a mesh for finite element analysis of an object.

Another object of the invention is to reduce drastically the time required for generating a mesh for the object by making the meshing process transparent to the user.

Another object of this invention is to provide such a method and apparatus which generate the mesh without the need for the user to specify other than the geometry of the object.

Still another object of the invention is to provide such a method and apparatus that refine elements of an initial mesh automatically to improve the mesh quality.

Yet another object of this invention is to provide such a method and apparatus that employ an expert system of rules in refining the mesh continuously until each element generated meets a standard of acceptability or can no longer be refined.

To achieve these objects, the illustrated method of mesh generation comprises a two-step automatic process that requires no user input once a geometric representation of the object has been provided to the apparatus. In the method, the object geometry is first defined in terms of object (subdomain) points, wherein each subdomain is a separate geometric region of the object such as a printed circuit board, a hole in the board, and a component mounted on the board. Bounding points defining a frame around the object geometry are then generated for producing a mesh that consists of at least one element. From the object points and the bounding points an initial mesh of elements is automatically generated according to a unique algorithm. In the second step of the process, each element in this mesh is then individually examined to determine if it meets a predetermined standard of acceptability and, if not, is refined. This process step employs a rule-based expert system to add additional points to the mesh at automatically determined locations for further mesh generation according to the unique algorithm. The steps of refinement repeat until each element in the mesh meets the acceptability standard or is deemed no longer refinable.

In the present embodiment, the method and apparatus comprise a computer program executable on a digital computer. The program defines the object geometry by gathering endpoints of each line segment. Where a curve exists, the curve is approximated by polyline segments and the endpoints of each segment are gathered. The program then marks those endpoints that define the beginning and end of each object subdomain. The unique algorithm employs the concept of "reserved" edges in generating the initial mesh. Reserved edges are edges of object subdomains across which an element should not reach.

In the second step of the process, the standard of acceptability employed in the present embodiment is a minimum angle for each element. Other standards such as an aspect ratio could be used. The rules of the expert system may be checked in a predetermined order and are applied, if necessary, in a manner that avoids a conflict.

The foregoing and other objects, features, and advantages of the invention will become more apparent from the following detailed description of a preferred embodiment which proceeds with reference to the accompanying drawings.

DETAILED DESCRIPTION

Introduction

Figure 1:
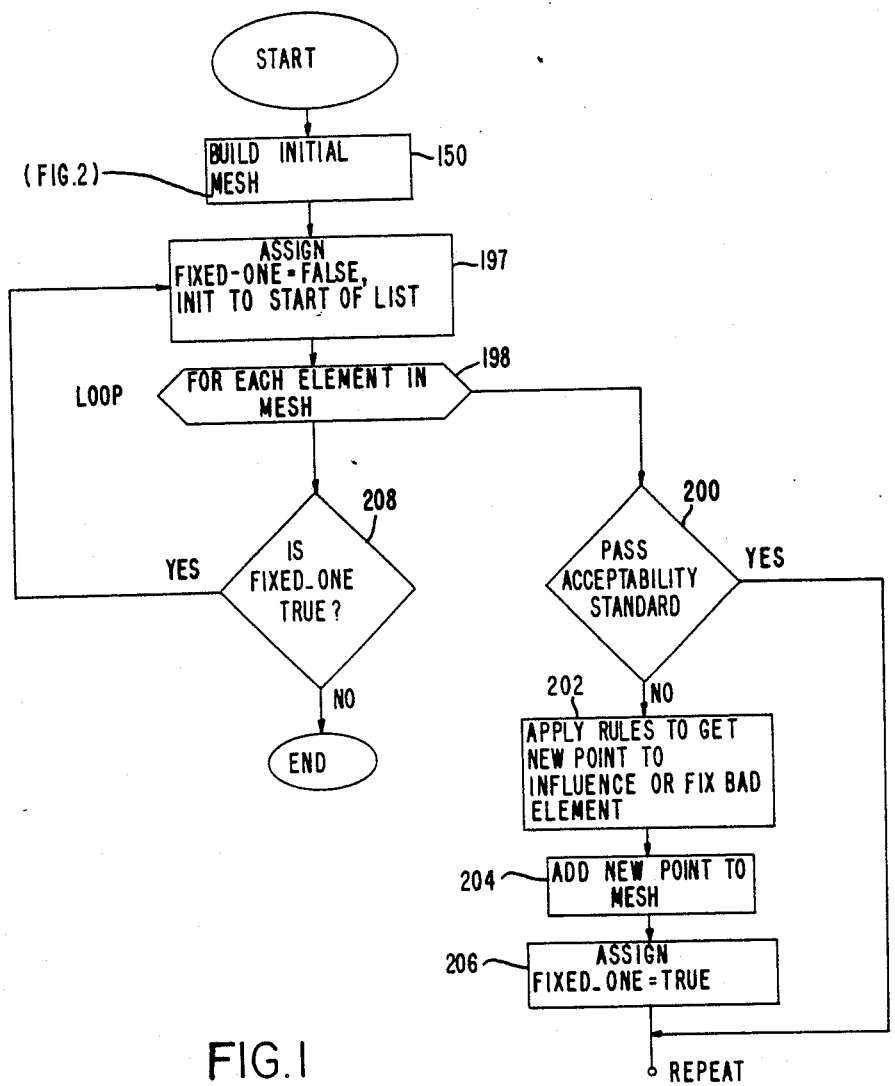
FIG. 1 is a flowchart of a portion of the method of the invention as embodied in a computer program executable within a computer.

The present invention comprises a method and apparatus for generating a mesh for finite element analysis (FEA) of an object. In this embodiment, the apparatus and method are embodied within a computer program adapted to run on a workstation manufactured by Apollo Computer, Inc., of Massachusetts or on another computer of comparable power. The program is written in the language of C++ from AT&T, although the program could be written in any language suitable for performing the steps to be described herein by one skilled in the art of programming. It should be understood, however, that the apparatus and method of the invention are not necessarily limited to the embodiment of a computer program executable on a computer. The description is given in this context only for the purpose of providing an enabling illustration of the invention.

The method of the mesh generation according to the present invention is a two-step automatic process that requires no user input once a geometric representation of the object has been provided to the program. Each of the two major process steps comprises a number of internal steps. Unlike prior FEA methods, an initial mesh of elements is generated directly in the first step from points the program selects that define the subdomains of the object. The mesh elements in the present embodiment are triangular in shape, although quadrilaterals or other polygons that are comprised of triangles could be created as an intermediate step if so desired. This initial mesh, however, is not usually satisfactory for finite element analysis. Many of the elements generated will likely have shapes that are unacceptable for analysis because of poor aspect ratios. That is, the ratio of the largest side or angle of the polygon to the smallest side or angle is too great. Elements with poor aspect ratios produce an ill-conditioned matrix that introduces error into the approximation of the characteristic due to the mesh.

To refine these elements so that they are acceptable, the second step of the process is employed. This step comprises the use of a rule-based expert system that applies a set of rules to refine each unacceptable element in the initial mesh. Without the need for input from the user, the method refines each element that fails to meet a predetermined standard of acceptability, such as an aspect ratio of no greater than 3:1 for each element. For each failing element, it is first determined which rule of the set "fires" to refine the element's shape. The appropriate rule is then applied. The above steps are repeated until each element is no longer refined by the application of a rule. This condition is met when all elements meet the predetermined standard or can no longer be refined.

Prior to performing the meshing method, the object geometry is entered into a data base associated with the program. The means of entry may take the form of a conventional computer-aided design (CAD) or equivalent drafting program that allows the user to enter a geometric representation of the object into the data base by simply drawing the object on the computer screen. Alternatively, geometric data representing the object may be entered as a data file or directly by the user via a keyboard. Whatever means of entry is used, a collection of points defining the object and specified by coordinates is provided in a conventional manner before the method begins. This definition of the object for generating the mesh is not necessarily limited to geometric data. Data on other physical characteristics of interest such as the object's thermal conductivities, material strength, etc., could also form the basis for mesh generation. For example, for an object such as a printed circuit board containing a number of components, the user may wish to generate a mesh based on the power distribution of the board. Consequently, data on the thermal properties of the board and each of its components would be entered. A data base associated with the present method would thus have stored therein a list of components and their thermal properties.

Means are provided in the program for defining the object in terms of points selected from the point collection within the data base. The points that are selected define each subdomain of the object. A subdomain is a separate geometric region of the object, such as a hole through the object, a component mounted on a circuit board or a rod pivotally attached to a piston. For line segments outlining the subdomain, the endpoints are selected. For a curve section such as a conic section, the curve is first approximated by polyline segments before selecting the endpoints of each of the segments. The endpoint that defines the beginning and end of each subdomain outline is then marked specifically for later recall. That marked point will be considered twice in generating elements in the initial mesh.

Figure 4:
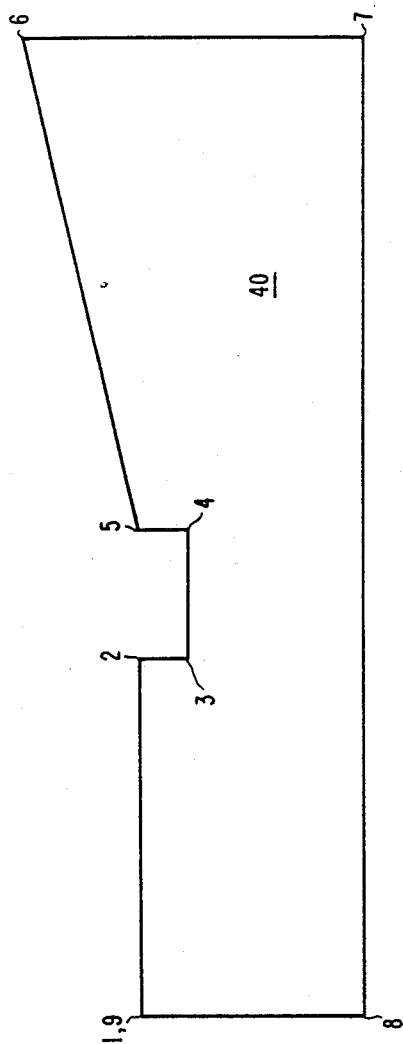
FIG. 4 is a computer screen display of an object entered by a user from which a mesh of elements for finite element analysis of the object is generated.

To assist in an understanding of the method, the description will proceed by way of an example. In FIG. 4, the screen display of an irregularly shaped object 40 such as a printed circuit board is shown entered into the computer memory for finite element analysis. This particular object has as its subdomains only the domain itself. To simplify the example without taking from its value, no components that would create other subdomains are included. In the object 40, there are eight separate endpoints of line segments, with the first endpoint defining the beginning (1) and the end (9) of the subdomain outline. The order of points is determined by the user in his manner of entering the geometric data representation of the object, such as by drawing it. Where no order is user-determined, the program defaults to a predetermined order.

Generating the Initial Mesh

Figure 2:
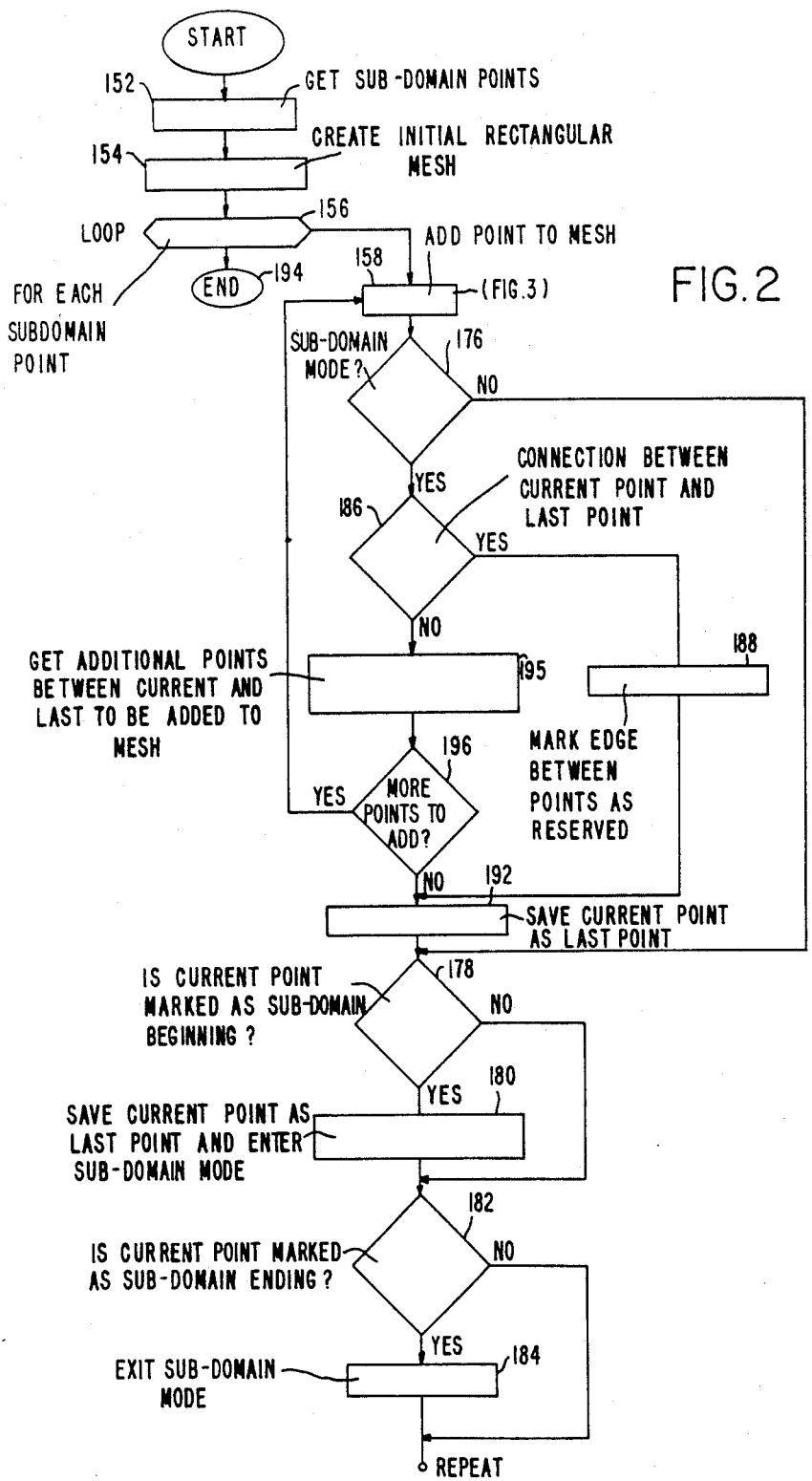
FIG. 2 is a flowchart of a second portion of the method.
Figure 3:
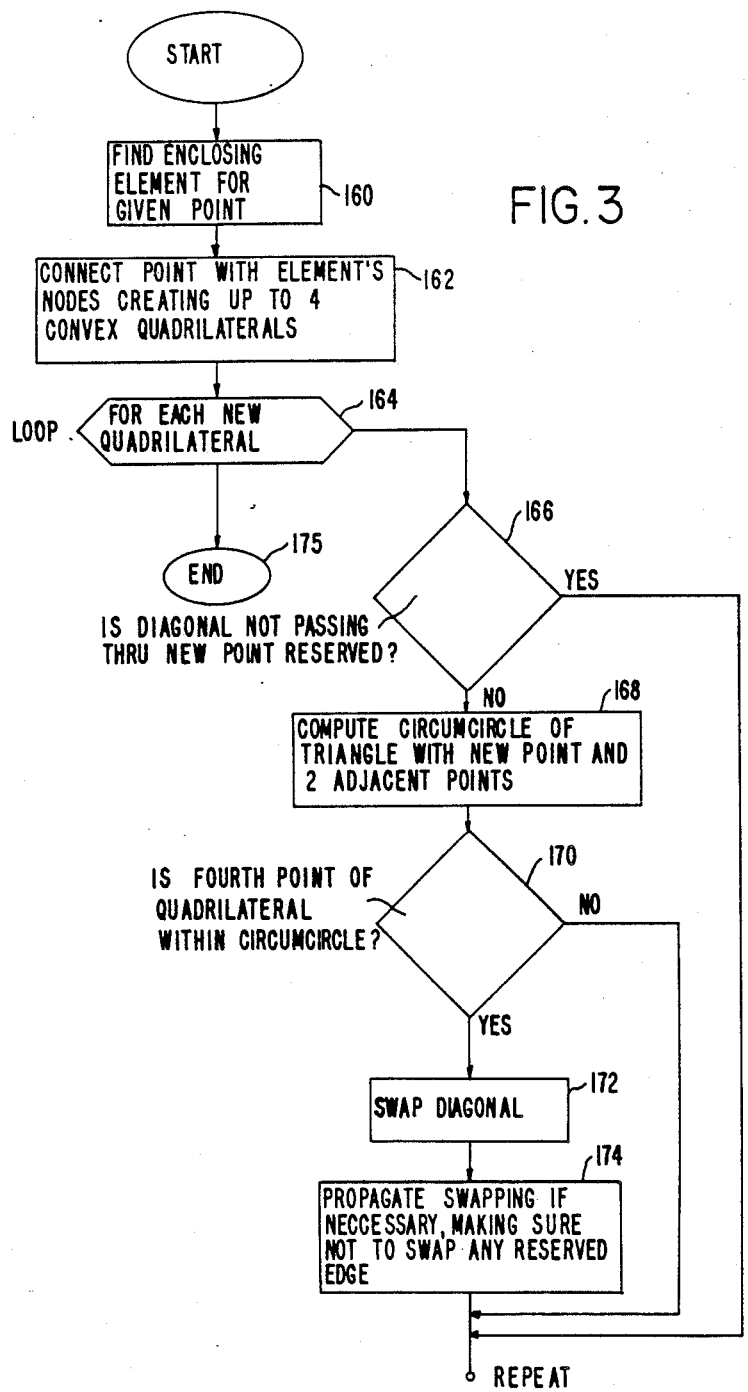
FIG. 3 is a flowchart of a third portion of the method.

Referring now to FIGS. 1-3 of the drawings, there are shown three flowcharts that illustrate the method and apparatus of the invention. FIG. 1 illustrates the overall method, with the first step being the guilding or generating the initial mesh of elements. The internal steps generating the mesh are illustrated in the flowcharts of FIGS. 2 and 3. For clarity, each step described herein will be followed by a numeral that identifies the step on the flowchart.

Figure 5:
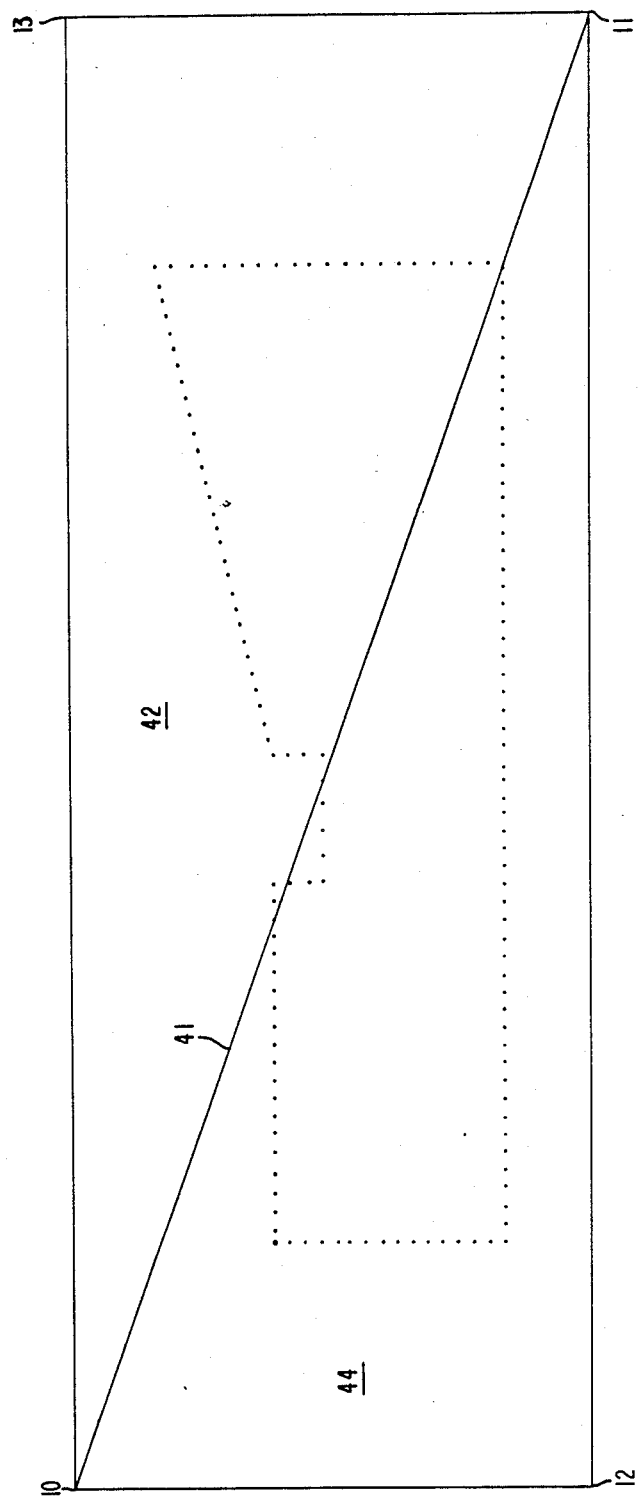
FIG. 5 is a screen display of an initial mesh provided by a rectangular frame generated around the domain of the object.

With the geometric data representation of the object 40 provided to the program within the computer, the method begins in FIG. 1 by executing that part of the program that builds the initial mesh (150). With reference immediately to FIG. 2, the object (subdomain) points of the object are first retrieved (152). In the present example, these are points 1-9 of object 40 shown in FIG. 4. The coordinates of these points are evaluated by the program, and as shown in FIG. 5 an initial bounding rectangular frame defined by four bounding vertices 10-13 is produced around the object 40 (154).

The frame is spaced a predetermined minimum distance from the object points to form a mesh boundary. In the present embodiment, the greatest x coordinate difference and y coordinate difference are calculated. A percentage of each difference is then added to the respective sides of the object to provide the spacing. Opposite endpoints 10 and 11 of the rectangular frame are then connected as a diagonal 41 to form a mesh of two triangular elements 42 and 44. Each subdomain point is now considered (156) and added separately within the mesh of elements 42 and 44 (158) to generate the initial mesh.

The internal steps for generating elements from the addition of the new subdomain point to the existing mesh are shown in FIG. 3. The algorithm therein is a unique modification of an algorithm created by B. Delaunay and described by D. T. Lee and B. J. Schachter in "Two Algorithms for Constructing a Delaunay Triangulation," *International Journal of Computer Information Science,* Vol. 9, No. 3 (1980). The modification, as will be described, takes into account the presence of "reserved" edges and thus enables the algorithm to generate an acceptable initial mesh. A reserved edge is a line connecting two subdomain pints and, in effect, forming a subdomain boundary.

Figure 6:
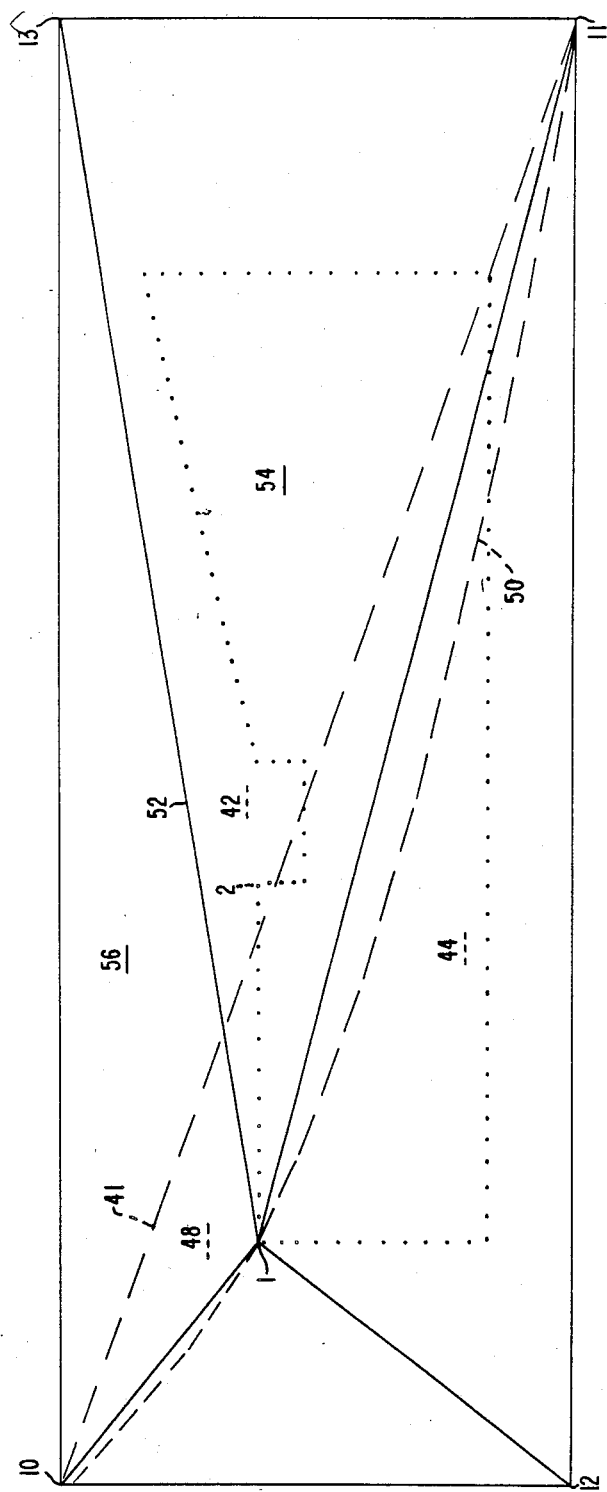
FIG. 6 is a screen display of the initial mesh as it appears after a first object point is added to the mesh.

With the subdomain point 1 added, the element enclosing this current point is found (160). Referring to FIG. 6, the original diagonal 41 of FIG. 5 is shown as a dashed line, with the subdomain point 1 enclosed within triangular element 44. The subdomain point is then connected to each of the element's nodes, points 10, 11, and 12, to construct or create three triangles and up to four convex quadrilaterals that each include a newly constructed triangle with the current subdomain point (162). In the present example, only one convex quadrilateral that has as its vertices points 1, 10, 13, and 11 is created at this stage.

Each quadrilateral created is then checked individually (164). First, the quadrilateral diagonal that does not pass through th subdomain point is checked to see if it is a reserved edge (166). This first diagonal is also an edge of the created triangle that includes the subdomain point. Once a reserved edge is formed in the mesh, it is not changed. Since point 1 is the first object point considered, however, no reserved edge has yet been created. The next step (168) computes the circumcircle of the newly created triangle 48 defined by points 1, 10, and 11. A circumcircle is a circle whose circumference passes through each vertex of a triangle. A portion of the circumcircle 50 for triangular element 48 is shown in FIG. 6. Point 13, the fourth point of the quadrilateral, is then checked to determine if it is within the circumcircle (170). In the example, point 13 lies well within the circumcircle and, consequently, the first quadrilateral diagonal 41 is swapped for the second quadrilateral diagonal 52 (172). The swapping of diagonals removes triangular element 48 and creates two new triangular elements that contain the current subdomain point, triangle 54 defined by points 1, 11, and 13 and triangle 56 defined by points 1, 10, and 13. The steps 166-172 are then repeated for each new quadrilateral created that contains a newly constructed triangle with the subdomain point 1 until no further diagonal swapping is required (174). In the present example, none of the other existing diagonals are swapped at this stage and the program returns to FIG. 2 (175).

In its next step shown therein, the program checks to see if it is in a "subdomain" mode (176). The subdomain mode is only entered by points following the first point. Initially, therefore, the program is not in its subdomain mode and it proceeds to determine if the current point, point 1, defines the beginning of a subdomain (178). Point 1 is indeed the beginning of the subdomain since it was entered first by the user. Point 1 is then saved as the last point considered and the subdomain mode is entered (180). The point is then checked to determine if it is the subdomain ending. The answer is negative. Point 1 is not the subdomain end, although it has the same coordinates with point 9 (182).

Figure 7:
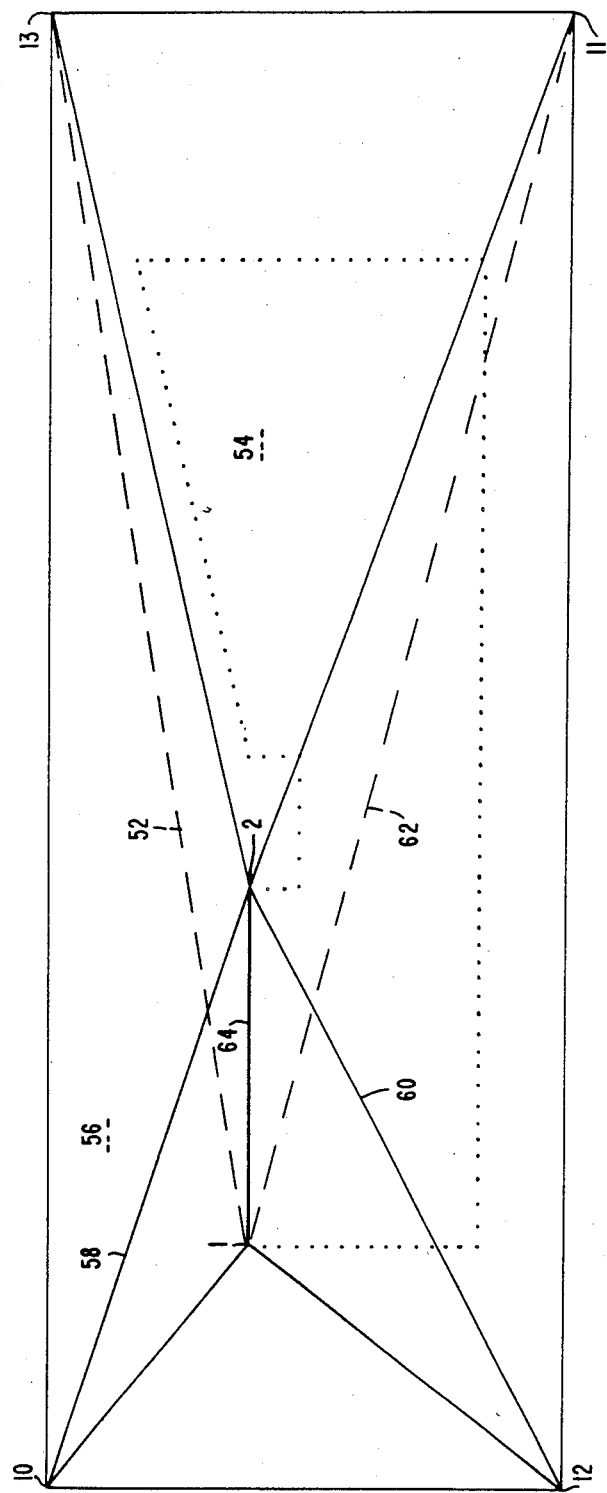
FIG. 7 is a screen display of the initial mesh as it appears after a second object point has been added to the mesh.

The program then loops back to step 156 in FIG. 2 and retrieves the next subdomain point, point 2. FIG. 7 illustrates the change in the mesh after the second subdomain point has been added. As before, the subdomain point is added (158), and the program branches to the steps of FIG. 3 to find the enclosing element for the point (160). The enclosing element is triangle 54, shown in solid lines in FIG. 6 and in dashed lines in FIG. 7. Point 2 is then connected with the vertices of the triangle 54 to create three new triangles and two new convex quadrilaterals. For each new convex quadrilateral created (164), the diagonal not passing through point 2 is checked to see if it is a reserved edge. In FIG. 7, these diagonals are marked as 52 and 62, respectively. In neither case is the diagonal a reserved edge (166). Computing the circumcircle (168) and checking for inclusion of the fourth quadrilateral vertex (170) results in the swapping of diagonal 52 for diagonal 58 and diagonal 62 for diagonal 60 (172). The newly created triangles and quadrilaterals are then checked to determine if further swapping is mandated (174).

Returning again to FIG. 2, the program now enters the subdomain mode (176) and the program checks to determine if there is now a connection in the mesh between the current point, point 2, and the last point, point 1 (186). In FIG. 7 there is such a connection and it is marked as a reserved edge 64 (188). Point 2 is then saved as the last point (192) as well as being the current point. Proceeding through the rest of the loop, point 2 is determined by the program not to be the subdomain beginning (178) or subdomain ending (182).

Figure 8:
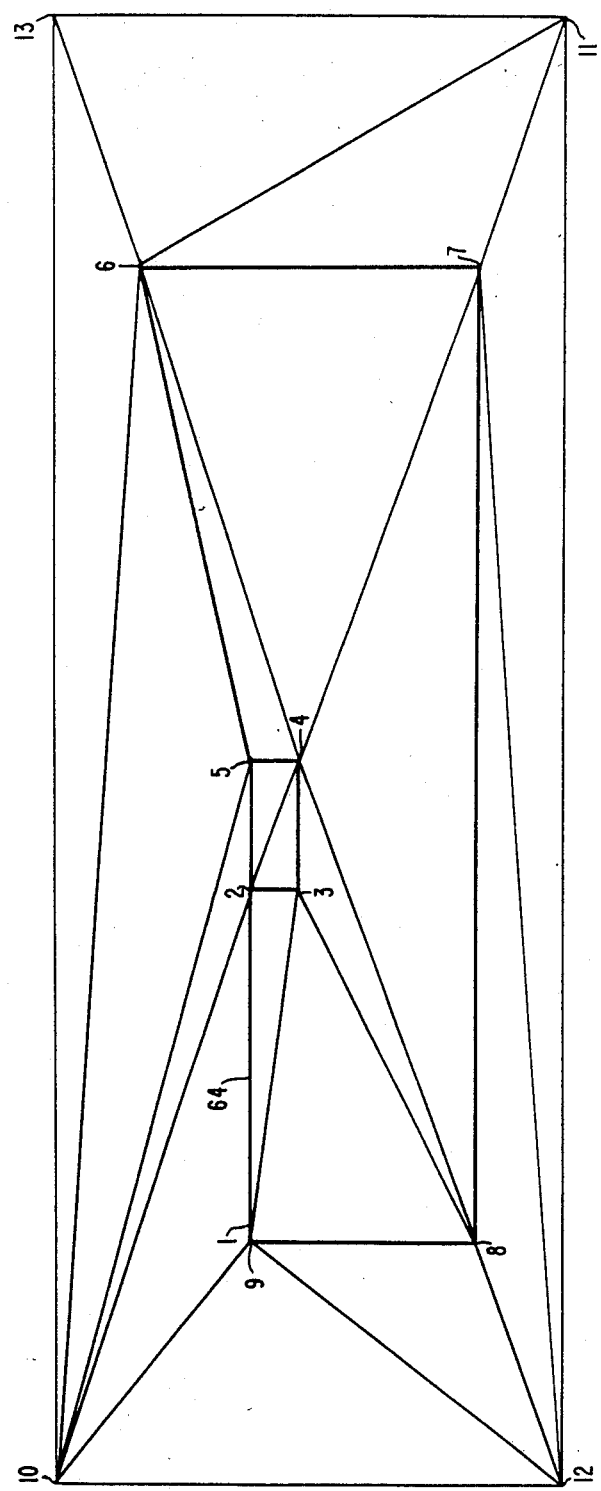
FIG. 8 is a screen display of the initial mesh after the last object point has been added to the mesh.

The program continues to loop back to step 156 of FIG. 2 until each of the subdomain points is placed within the mesh and the resulting mesh elements generated. FIG. 8 shows the completion of the initial mesh after the ninth, ending point has been considered. At step 182, point 9 is determined to be the subdomain ending and the program exits the subdomain mode (184). If another subdomain were present, such as a component mounted on the object 40, the program would loop back to step 156 and continue again. Once all subdomain points in the entire domain have been added, the program exits the loop (194) and returns to FIG. 1 to proceed with the next step.

In some instances, no connection is made between the current subdomain point added and the previous, last point (186). For an elongated object, for example, another line may cross between two points on a subdomain boundary such as between points 7 and 8. In such a case, the program generates additional points on the subdomain boundary in an attempt to change the mesh and build the reserved edge (195). First, a new point is added at a location on the subdomain boundary between the two object points such that no element edge crosses the subdomain boundary between the new point and the previous point (196). The program branches (158) to the meshing algorithm of FIG. 3. This will build a reserved edge between this new point and the last point. More importantly the new point will have changed the mesh and possibly removed the original crossing element edge. This process through step 186, 195, and 196 continues with new points continually added until the reserved edge between the current and previous point is complete.

Refining the Mesh

Many of the elements of the initial mesh may be unacceptable because of their poor aspect ratio for a valid finite element analysis of the object. In the second step of the process, each element is analyzed to determine if it meets a predetermined standard of acceptability and, if not, it is automatically refined. The process of refinement adds additional points according to a rule-based expert system. The additional points increase the number of elements and change the appearance of the mesh.

Referring again to FIG. 1, the second step begins with assigning FALSE to a Boolean variable Fixed__ One (197) and the initialization to the start of a list of the elements generated by the program. Each element in the mesh is then checked individually (198). First, the program determines if the element meets the standard of acceptability (200). This standard can take many forms but typically is a desired aspect ratio or minimum element angle such as 25° in the present embodiment. It should be noted that the greater the minimum angle required, the more time-consuming the mesh generation. Twenty-five degrees, it is believed, provides an acceptable mesh for analysis purposes while still allowing extremely fast mesh generation. Moreover, angle determination is preferred over length of edge determination because the angle calculation can be made much faster. Whatever standard is chosen, an element that meets it is considered acceptable for finite element analysis.

Elements that fail the standard are refined by the expert system according to the set of rules that are constructed to apply to the mesh without conflict. These rules, with the antecedent mesh condition that causes each to "fire," are listed below in their order of application:

1. The triangle has three edges either reserved and/or on the mesh boundary:
   Mark this element as undefinable.
2. The triangle has two edges either reserved and/or on the mesh boundary:
   If the shortest edge in this element is reserved,
      Place a node at the midpoint of the longest of the reserved edges and/or on the mesh boundary
      else Mark this element as undefinable.
3. The triangle's longest edge is either reserved and/or on the mesh boundary:
   Place a node on that edge ⅜ of the way from the minimum angle vertex.
4. The neighboring triangle across from this triangle's longest edge does not have its longest edge either reserved and/or on the mesh boundary:
   If an element containing the triangle's circumcenter has the element's longest edge reserved or on the boundary:
      Place a node at the midpoint of that edge else
      Place a node at center of the triangle's circumcircle.
5. Rule 4 has fired but placed the new point either outside the mesh boundary or across a reserved edge from the unacceptable element, where it has no effect:

Place a node at the intersection of the line connecting the center of the circumcircle to the triangle's centroid and the nearest reserved edge.

6. The neighboring triangle across from the triangle's longest edge has an edge either reserved and/or on the mesh boundary:

Place a node at the midpoint of the neighbor's longest edge.

7. The triangle has an edge either reserved and/or on the mesh boundary:

Place a node at the midpoint of that edge.

8. Otherwise:

Place a node at the triangle's centroid.

The rules are examined in the predetermined order until one is found that applies. The order of rules is chosen to minimize the time required to refine the elements of the mesh. Rule 1 is a trivial rule that covers the rare case of an element which has all its edges reserved. In Rule 3, the $\frac{2}{3}$ distance specified is preferred, but the rule will work within a range of between $\frac{1}{4}$ and $\frac{1}{2}$ of the way from the minimum angle vertex. Rules 8 and 9 are "catchall" rules that rarely fire. Both Rules 8 and 9 are intended to influence the area around an element such that either the swapping of the Delaunay triangulation algorithm or the addition of more nodes by these rules will improve the element's shape.

In application of the rules, the algorithm of FIG. 3 is applied each time a node (point) is added. The new node may generate other elements that have unacceptable shapes. Eventually, however, all elements created will pass the acceptability standard or be considered no further refinable.

Figure 9:
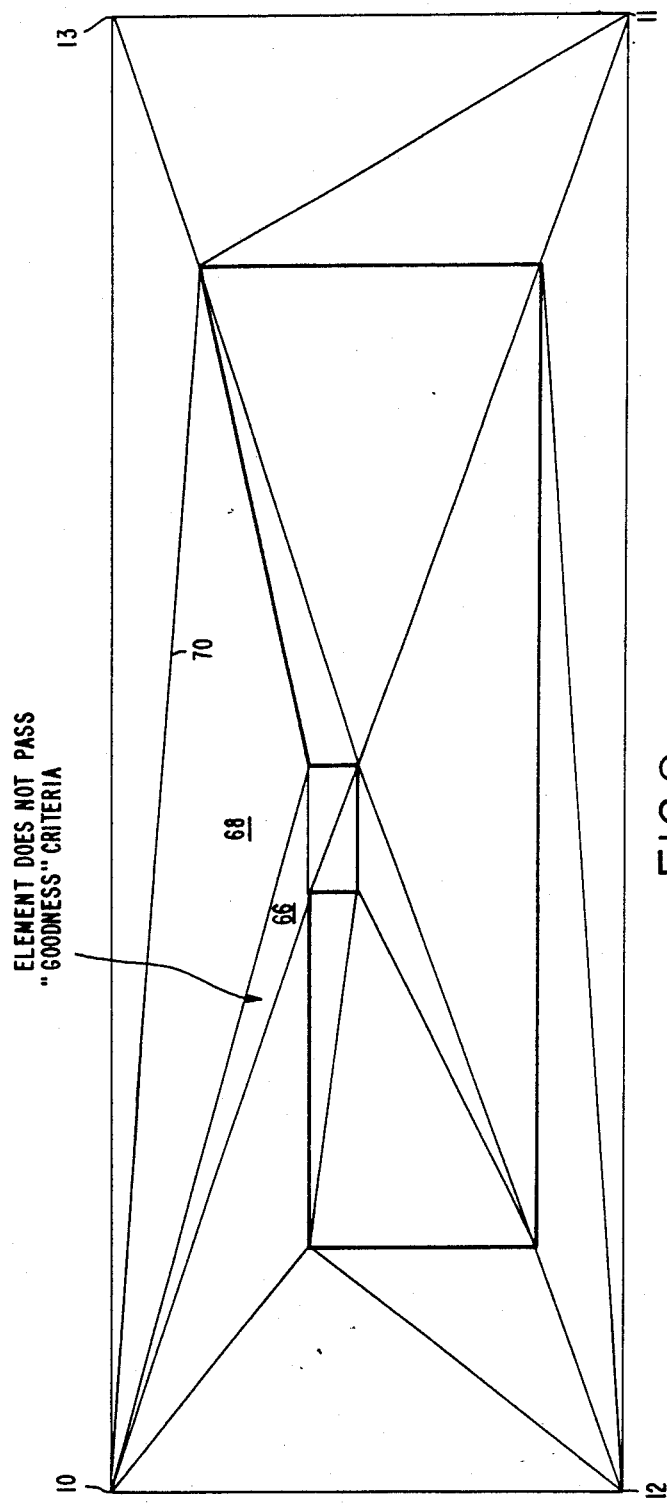
FIG. 9 is a screen display of the mesh illustrating the detection of an element that has failed to meet a predetermined standard of acceptability.
Figure 10:
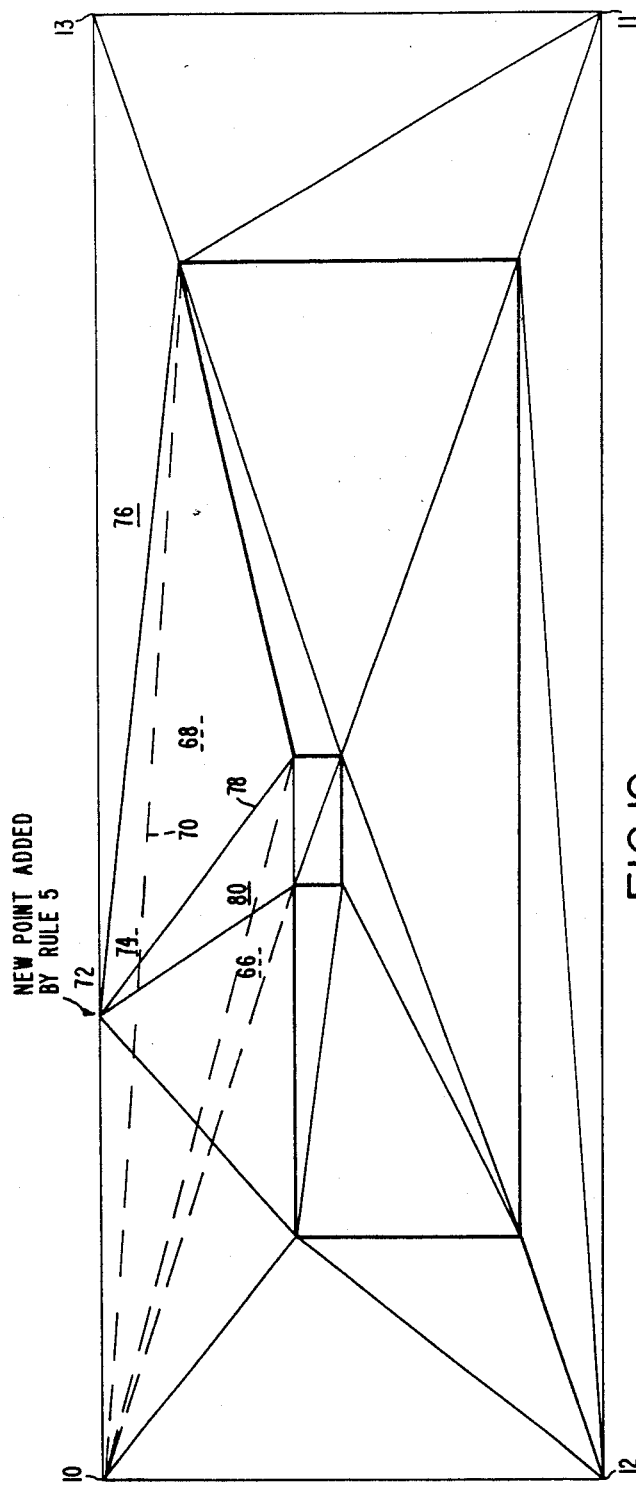
FIG. 10 is a screen display of the mesh after an expert system rule has been applied to refine the unacceptable element.

Referring now to FIG. 9, triangular element 66 is shown that does not pass th standard of acceptability because it minimum angle is less than the minimum specified. The rules are then applied to this element (202) in the numerical order given. With respect to Rules 1-3, none of the edges of triangle 66 are reserved or are on the mesh boundary Rule 4 initially applies because the neighboring element 68 across from the longest edge does not have its longest edge 70 either reserved or on the mesh boundary. But the center (not shown) of the circumcircle containing triangle 66 is outside the mesh boundary, causing Rule 4 to be superseded by Rule 5. Under Rule 5, a new node 72 is placed at the intersection of a line connecting the center of the circumcircle to the triangle centroid and the nearest reserved edge (204). FIG. 10 shows where this new node is located in the mesh, with dashed lines showing the mesh prior to application of the FIG. 3 algorithm and the solid lines showing the mesh after the algorithm's application. The steps of FIG. 3 are now followed after the new point is added (204). Note that in this case the new node is placed directly on an existing line. Only two triangles 74 and 76 are created. One quadrilateral is considered "degraded" because points 10, 72, and 13 lie on the same line. Nevertheless, the steps of the algorithm are followed. Diagonal 70 is swapped for a second diagonal 78 to construct new triangle 80 that also contains point 72. The circumcircling and swapping continue until the nonelement point of each quadrilateral lies outside the circumcircle. The variable Fixed_One is then changed to TRUE to note that a change has been made in the mesh (206). This alerts the program that a following pass through the elements is required because additional elements have been added to the element list and other elements may have changed shape.

Figure 11:
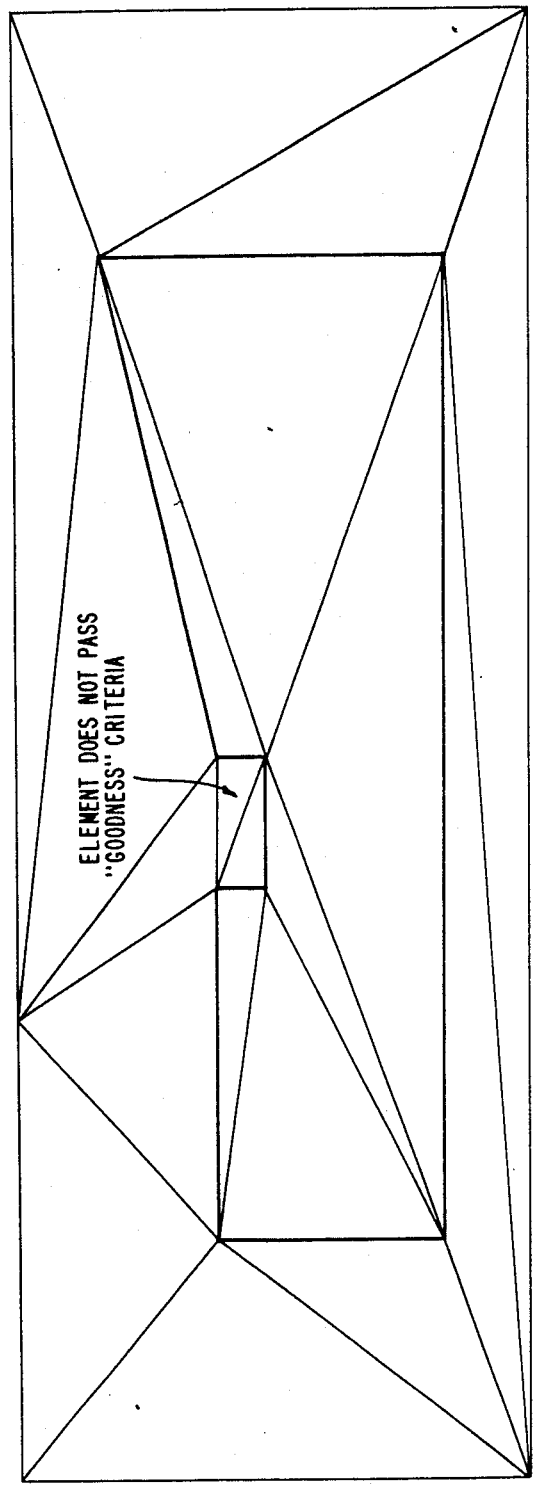
FIG. 11 is a screen display of the mesh illustrating the detection of the second element that has failed to meet the predetermined standard of acceptability.
Figure 12:
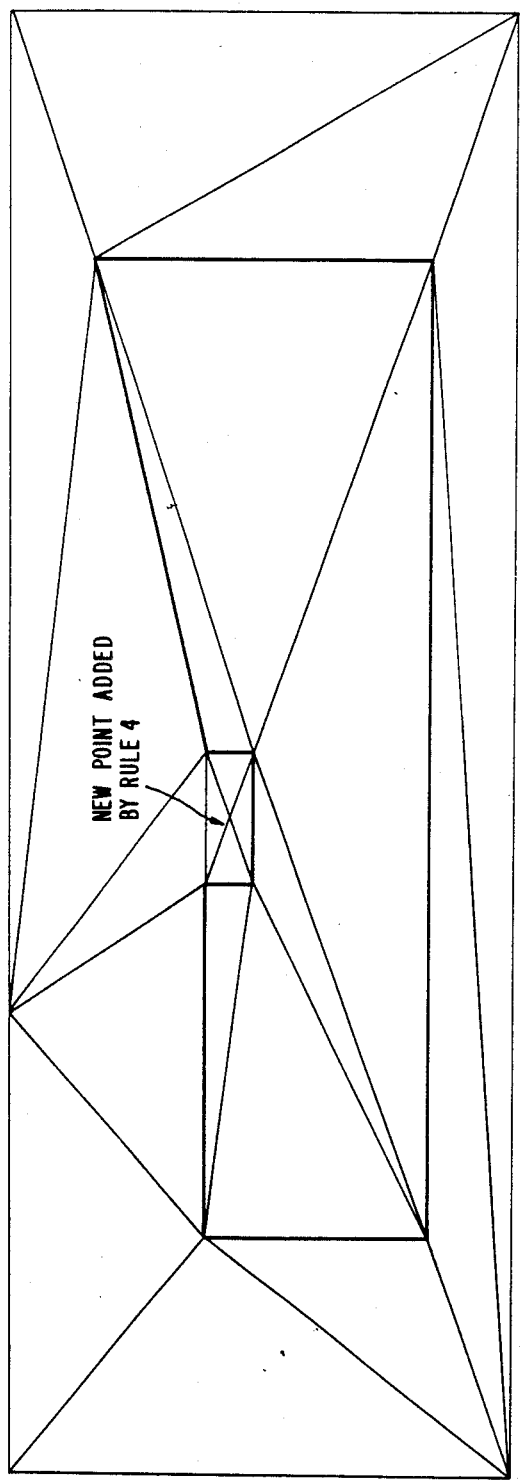
FIG. 12 is a screen display of the mesh after another expert system rule has been applied to refine the unacceptable element.
Figure 13:
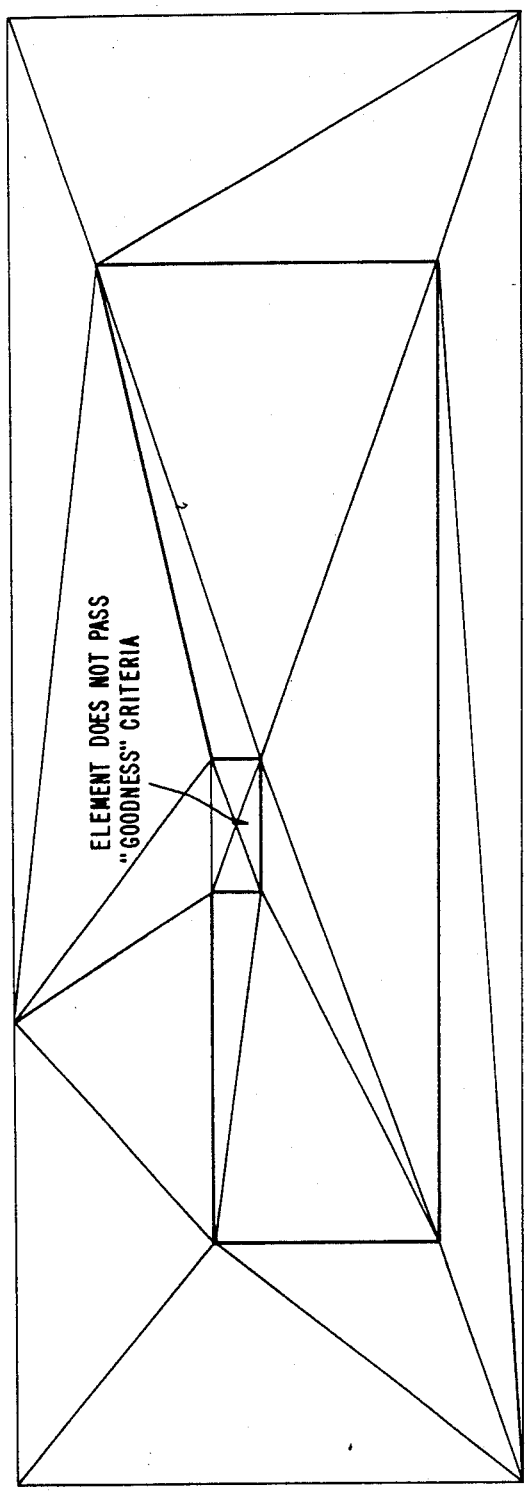
FIG. 13 is a screen display of the mesh illustrating the detection of a third unacceptable element.
Figure 14:
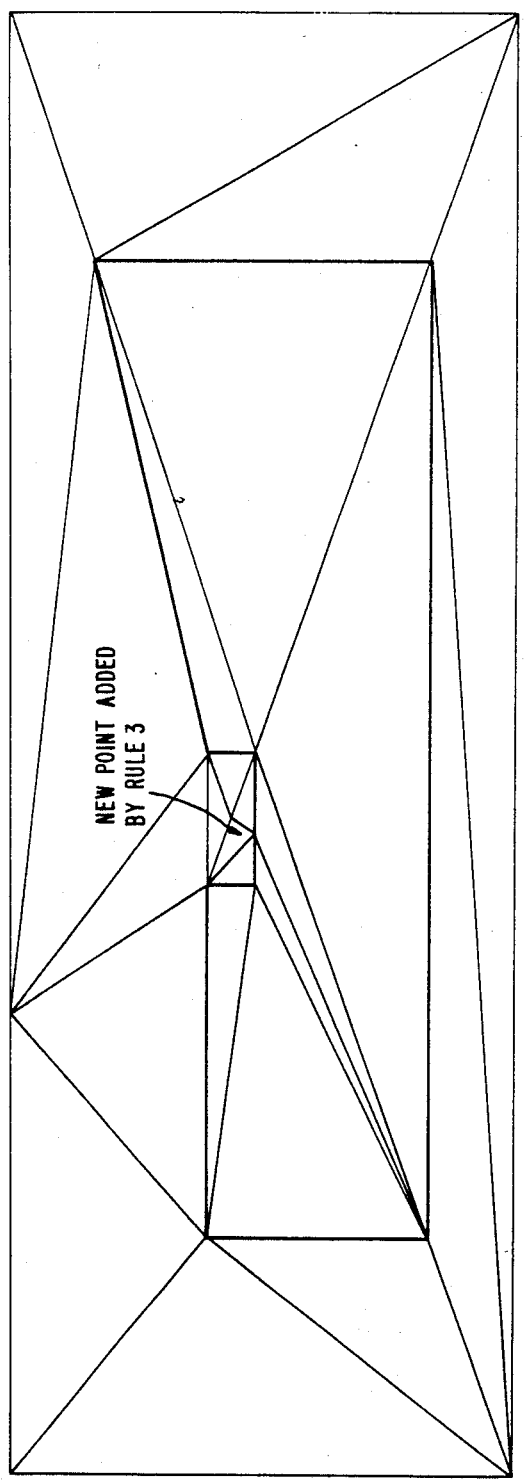
FIG. 14 is a screen display of the mesh after another expert system rule has been applied to refine the unacceptable element.
Figure 15:
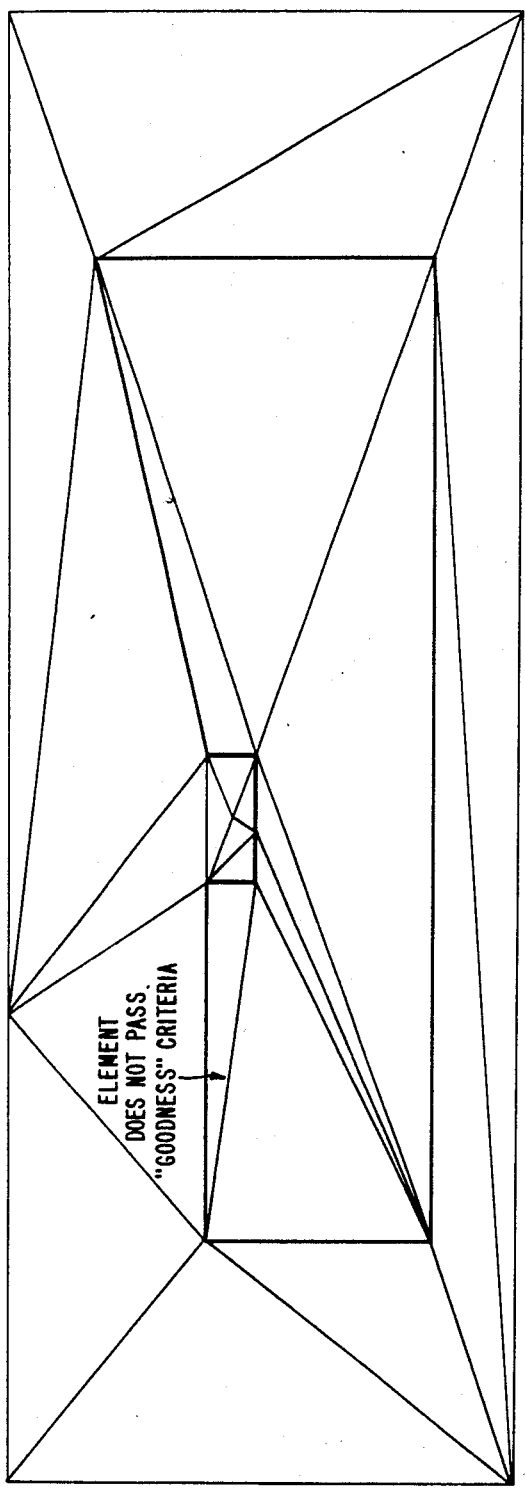
FIG. 15 is a screen display of the mesh illustrating the detection of a fourth unacceptable element.
Figure 16:
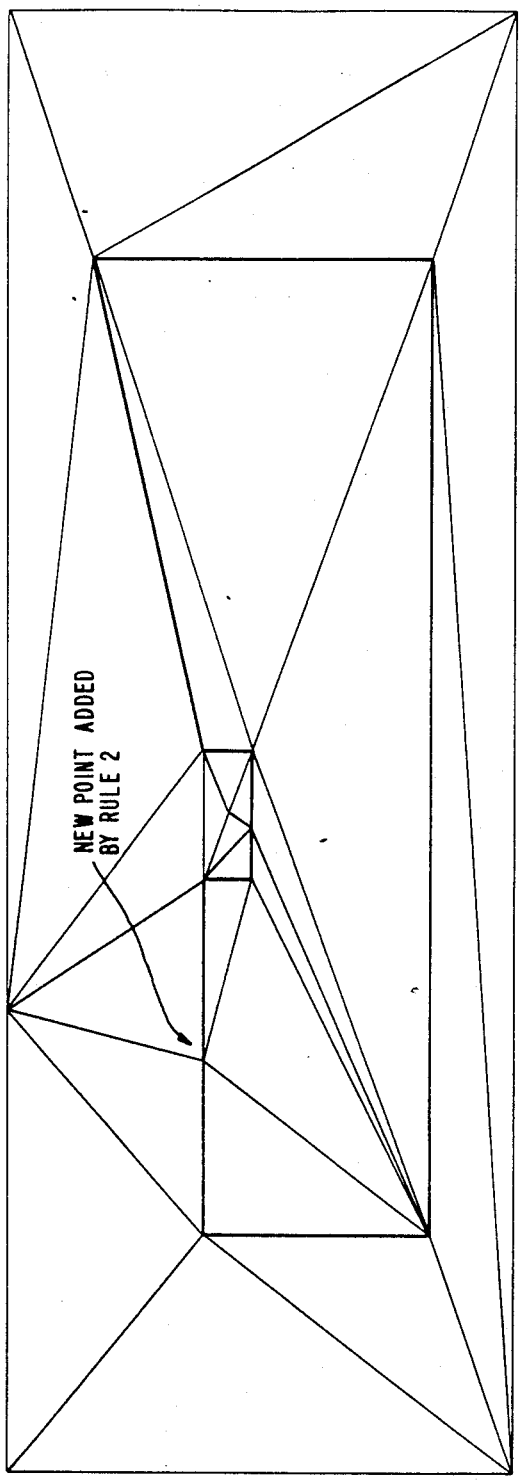
FIG. 16 is a screen display of the mesh after another expert system rule has been applied to refine the unacceptable element.
Figure 17:
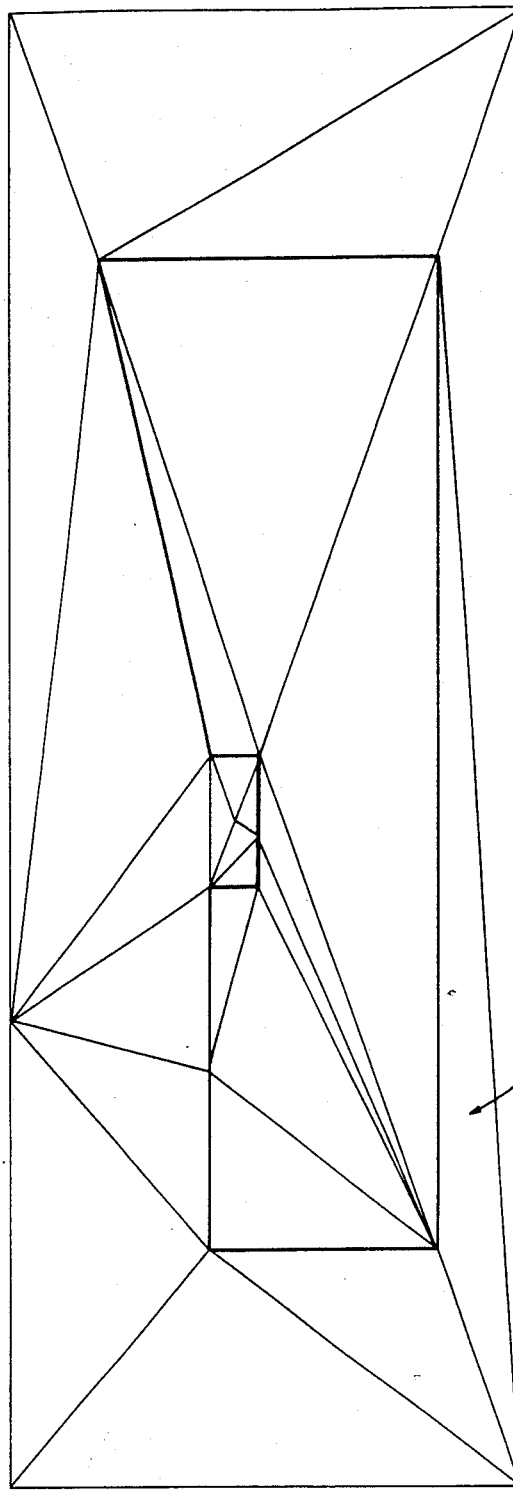
FIG. 17 is a screen display of the mesh illustrating the detection of a fifth unacceptable element.
Figure 18:
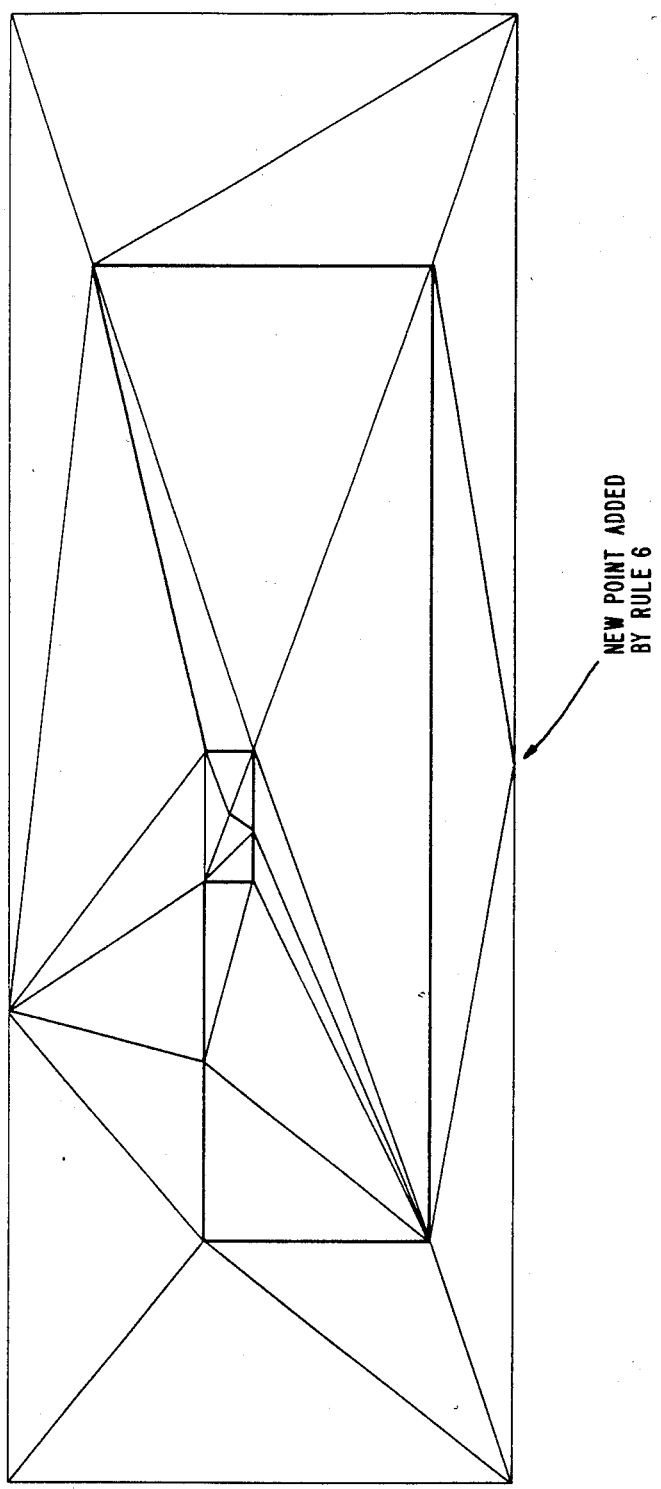
FIG. 18 is a screen display of the mesh after another expert system rule has been applied to refine the unacceptable element.
Figure 19:
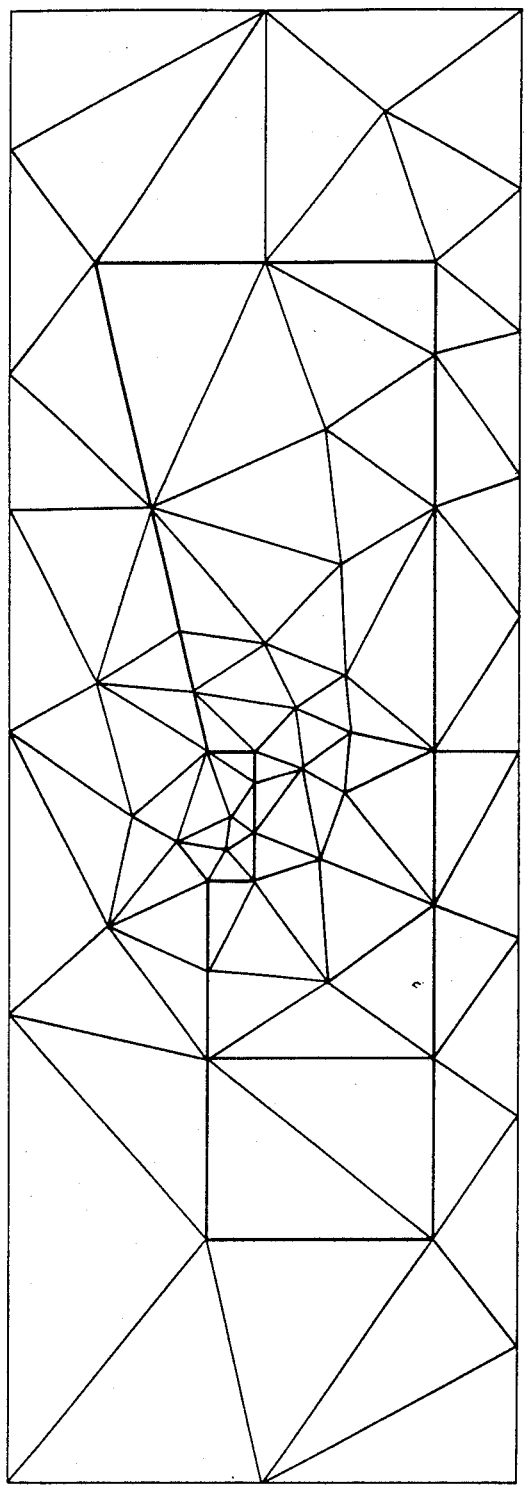
FIG. 19 is a screen display of the final mesh after refinement.

The next element in the list (198) is then checked for acceptability (202) in the same manner. FIGS. 11 and 12 show another unacceptable element and the new node added in response by Rule 4. FIG. 13 shows a third unacceptable element and FIG. 14 the application of and response by Rule 3. FIG. 15 shows a fourth unacceptable element and FIG. 16 the application of and response by Rule 2. Similarly, FIG. 17 shows a fifth unacceptable element and FIG. 18 the application of and response by Rule 6. FIG. 19 shows the final refinement of the mesh.

Once each element in the list has initially been checked, the program evaluates Fixed_One (208). *If any elements were unacceptable, the list is reinitialized and another pass is made through all the elements, with the new elements now added to the list. This step continues until all elements either meet the acceptability standard or are considered no longer refinable.*

Generation of the final mesh completes the preprocessing step. For processing, the elements outside the domain boundary are not considered. Their purpose is to assist in the mesh generation of arbitrarily shaped geometries.

Figure 20:
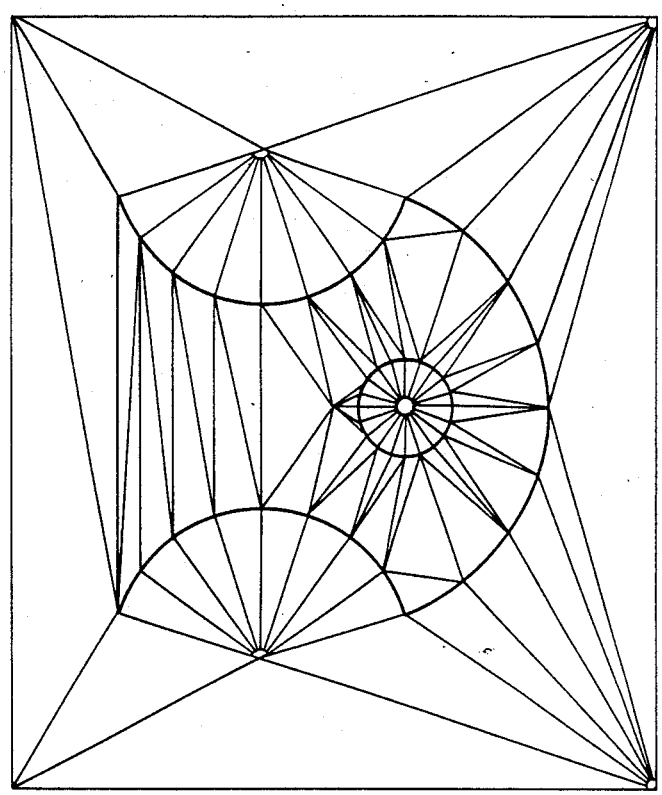
FIG. 20 is a screen display of the initial mesh of an arbitrarily shaped domain that includes a separate subdomain.
Figure 21:
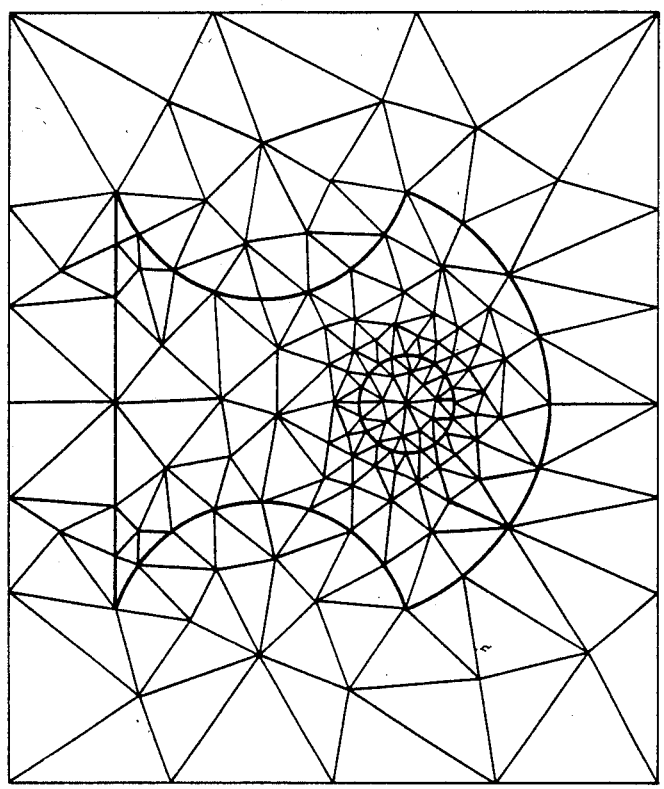
FIG. 21 is a screen display of the final mesh created for the domain of FIG. 20.
Figure 22:
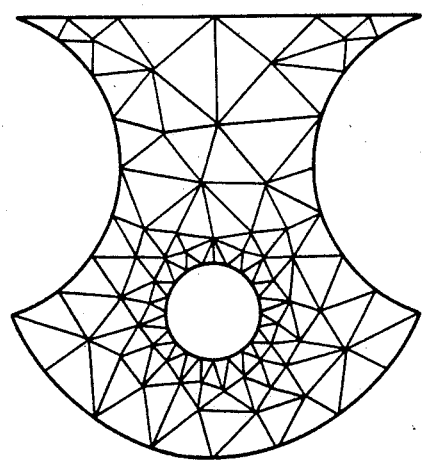
FIG. 22 is a screen display of the final mesh of FIG. 21 with elements outside the domain removed.

FIGS. 20-22 show an example of another arbitrarily shaped object for which a mesh is generated. The subdomain points herein include points from polyline segments on the curve as well as points of an inner circle defining a separate subdomain. FIG. 20 shows the initial mesh; FIG. 21 shows the final mesh; and FIG. 22 the final mesh with the elements outside the domain removed.

To place in perspective the improvement offered by the present invention over the prior art, this method generated a complete mesh for the object 40 in about one second. The mesh for the arbitrarily shaped object of FIGS. 20-22 was completed in about four seconds. A mesh for a printed circuit board with 25 components took about 13 seconds and for a board with 1,000 components, one and a half minutes. Prior art methods would have taken from hours to days.

Having illustrated and described the principles of the invention in a preferred embodiment, it should be apparent to those skilled in the art that the invention can be modified in arrangement and detail without departing from such principle. We claim all modifications coming within the spirit and scope of the following claims.

We claim:

1. Apparatus for generating a mesh of elements for finite element analysis of an object, comprising:
    means for defining the object geometry in terms of points;
    means for generating bounding points around the object; and
    means for generating from the bounding points and object points a mesh of elements.

2. The method of claim 1 including means for refining each element that fails to meet a predetermined standard of acceptability.

3. Apparatus for generating a mesh of elements for finite element analysis of an object, comprising:
    means for defining the object geometry in terms of points;
    means for generating from the object points an initial mesh; and
    means responsive to the initial mesh for refining each element that fails to meet a predetermined standard of acceptability.

4. A method of generating a mesh of elements for finite element analysis of an object, comprising:
   defining the object geometry in terms of points;
   generating bounding points around the object geometry for producing a mesh with an element;
   generating from the bounding points and object points a mesh of elements; and
   refining each element that fails to meet a predetermined standard for acceptability.

5. The method of claim 4 in which defining the object geometry comprises:
   deriving a polyline segment approximation of each curved section that may exist in the object geometry;
   gathering endpoints of each line segment of the object; geometry; and
   marking the endpoints that define the beginning and end of each subdomain of the object geometry.

6. The method of claim 4 in which generating bounding points around the object comprises constructing a frame around the object and connecting opposite end points of the frame to form an initial mesh of elements.

7. The method of claim 4 in which generating a mesh of elements comprises;
   adding an object point within an enclosing element having nodes;
   constructing elements by connecting the object point with each node of the enclosing element;
   circumcircling each constructed element that comprises a portion of a convex quadrilateral having nodes to determine if a node of the quadrilateral lies within the circle created; and
   if a quadrilateral node lies within the circle created, swapping a first quadrilateral diagonal for the second quadrilateral diagonal to change the shape of the constructed element.

8. The method of claim 7 including skipping the diagonal swapping if the first quadrilateral diagonal connects the added object point with another object point.

9. The method of claim 4 in which refining each element comprises:
   adding a point to the existing mesh according to a rule applied in response to an antecedent mesh condition; and
   regenerating the mesh with the added point to change the shape of the element.

10. The method of claim 4 in which refining each element comprises:
    determining which rule of a set of rules should be applied to the element to refine its shape;
    applying the rule to the element; and
    repeating the above steps until each element in the mesh meets the standard of acceptability or can no longer be refined.

11. The method of claim 10 in which the rules are applied in a predetermined order to minimize the time required to refine the elements of the mesh.

12. The method of claim 10 in which the rules are constructed so that they apply without conflict.

13. The method of claim 4 in which refining each element comprises:
    determining if the element has three edges either reserved against change and/or on the mesh boundary; and 14. The method of claim 4 in which refining each element comprises:
    determining if the element has two edges either reserved against change and/or on the mesh boundary;
    if so, determining if a shortest edge in the element is reserved;
    if the shortest edge is reserved, determining a longest of the two edges that are either reserved and/or on the mesh boundary and placing a point at the midpoint of the longest edge;
    if the shortest edge is not reserved, marking this element as undefinable; and
    regenerating the mesh if the point is added.

15. The method of claim 4 in which refining each element comprises:
    determining if the element's longest edge is either reserved against change and/or on the mesh boundary;
    if so, place a point on that edge ¼ to ½ of the way from a minimum angle vertex of the element; and
    regenerating the mesh if the point is added.

16. The method of claim 4 in which refining each element comprises:
    determining if the neighboring element across from the element's longest edge does not have its longest edge either reserved against change and/or on the mesh boundary;
    if so, determining if an element containing the circumcenter of the element to be refined has a longest edge reserved or on the mesh boundary;
    if the containing element does have such an edge, placing a point at the midpoint of that edge;
    if the containing element does not have such an edge, placing a point at the center of the circumcircle; and
    regenerating the mesh if the point is added.

17. The method of claim 16 further comprising:
    determining if the added point is placed outside the mesh boundary or across a reserved edge from the element to be refined;
    if so, replacing the prior point with a point at the intersection of the line connecting the center of the circumcircle to the element's centroid and the nearest reserved edge; and
    regenerating the mesh.

18. The method of claim 4 in which refining the element comprises:
    determining if the neighboring element across from the element's longest edge has an edge either reserved and/or on the mesh boundary;
    if so, placing a point at the midpoint of the neighboring element's longest edge; and
    regenerating the mesh if the point is added.

19. The method of claim 4 in which refining the element comprises:
    determining if the element has an edge either reserved or on the mesh boundary;
    if so, placing a point at the midpoint of the edge; and
    regenerating the mesh if the point is added.

20. The method of claim 4 in which refining each element comprises:
    placing a point at the element's centroid; and
    regenerating the mesh.

* * * * *

UNITED STATES PATENT AND TRADEMARK OFFICE
CERTIFICATE OF CORRECTION

PATENT NO. : 4,912,664

DATED : March 27, 1990

INVENTOR(S) : Jonathan Weiss and Patrick D. Fortner

It is certified that error appears in the above-identified patent and that said Letters Patent is hereby corrected as shown below:

Column 5, line 52, "guilding" should be --building--
Column 6, line 24, "pints" should be --points--
Column 6, line 40, "th" should be --the--
Column 8, line 46, "undefinable" should be --unrefinable--
Column 8, line 52, "else Mark this element as undefinable." should be
--else  Mark this element as undefinable.--
Column 8, line 63, "edge else" on the same line should be
--edge
else--
Column 9, line 34, "th" should be --the--
Column 9, line 35, "it" should be --its--
Column 9, line 39, "boundary" should be --boundary.--
Column 10, lines 14-18 italicized print should be changed to conform with the rest of the document.
Column 10, line 45, "principle" should be --principles--

Column 11, line 16, "object; geometry;" should be --object geometry;--
Column 11, line 24, "comprises;" should be --comprises:--

UNITED STATES PATENT AND TRADEMARK OFFICE
CERTIFICATE OF CORRECTION

PATENT NO.  : 4,912,664

DATED       : March 27, 1990

INVENTOR(S) : Jonathan Weiss, et al.

It is certified that error appears in the above-identified patent and that said Letters Patent is hereby corrected as shown below:

Column 11, line 65 [line omitted], should be --if so, marking the element as unrefinable.--
    Column 12, line 13, "undefinable" should be --unrefinable--

Signed and Sealed this

Twenty-third Day of June, 1992

Attest:

DOUGLAS B. COMER

*Attesting Officer*    *Acting Commissioner of Patents and Trademarks*